US007230963B2

(12) United States Patent
Menon et al.

(10) Patent No.: US 7,230,963 B2
(45) Date of Patent: Jun. 12, 2007

(54) MONOLITHIC WAVELENGTH STABILIZED ASYMMETRIC LASER

(75) Inventors: Vinod M. Menon, Lawrenceville, NJ (US); Shubhashish R. Datta, New Haven, CT (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 11/108,039

(22) Filed: Apr. 14, 2005

(65) Prior Publication Data

US 2006/0013273 A1    Jan. 19, 2006

Related U.S. Application Data

(60) Provisional application No. 60/562,008, filed on Apr. 14, 2004.

(51) Int. Cl.
*H01S 5/00*    (2006.01)
(52) U.S. Cl. .................. 372/50.21; 372/50.1; 356/478
(58) Field of Classification Search .................. 372/75, 372/69, 33, 50.1, 50.21
See application file for complete search history.

(56) References Cited

U.S. PATENT DOCUMENTS

| 5,039,189 A | 8/1991 | Lytel et al. ..................... 385/2 |
| 5,078,516 A | 1/1992 | Kapon et al. ................ 385/129 |
| 5,140,149 A | 8/1992 | Sakata et al. ............ 250/211 J |
| 5,208,878 A | 5/1993 | Thulke ......................... 385/14 |
| 5,325,379 A | 6/1994 | Amann ......................... 372/20 |
| 5,355,386 A | 10/1994 | Rothman et al. ............. 372/50 |
| 5,499,259 A | 3/1996 | Makita ......................... 372/45 |
| 5,500,867 A | 3/1996 | Krasulick ................ 372/38.02 |
| 5,509,094 A | 4/1996 | Minami et al. ................ 385/29 |
| 5,511,084 A | 4/1996 | Amann ......................... 372/20 |
| 5,568,311 A | 10/1996 | Matsumoto ................. 359/344 |
| 5,574,742 A | 11/1996 | Ben-Michael et al. ........ 372/45 |
| 5,623,363 A | 4/1997 | Liou .......................... 359/344 |
| 5,663,824 A | 9/1997 | Koch et al. ................. 359/184 |

(Continued)

FOREIGN PATENT DOCUMENTS

CN    1118527    3/1996

(Continued)

OTHER PUBLICATIONS

Tauke-Pedretti, A., et al., "High saturation power and high gain integrated photoreceivers," *IEEE Photonics Technology Letts.*, 2005, 17(10), 2167-2169.

(Continued)

*Primary Examiner*—Minsun Oh Harvey
*Assistant Examiner*—Tuan N. Nguyen
(74) *Attorney, Agent, or Firm*—Woodcock Washburn LLP

(57) ABSTRACT

A monolithic wavelength stabilized system comprises a laser monolithically formed with a waveguide splitter having at least two branches. Non-identical resonators having different wavelengths are operatively coupled to each branch of the splitter and a photodiode is communicatively coupled to receive the output from each non-identical resonator. A control unit receives the photocurrent outputs from the photodiodes, determines based on the photocurrents whether the wavelength of the laser signal is at a desired value, and transmits a feedback signal to the laser to move the laser output toward the desired wavelength. The laser, splitter, resonators, and photodiodes are monolithically formed in a single chip using asymmetric waveguides.

45 Claims, 13 Drawing Sheets

U.S. PATENT DOCUMENTS

| | | | |
|---|---|---|---|
| 5,708,671 A | 1/1998 | Siao et al. | 372/20 |
| 5,715,268 A | 2/1998 | Lang et al. | 372/50 |
| 5,721,750 A | 2/1998 | Kwon et al. | 372/44 |
| 5,852,687 A | 12/1998 | Wickham | 385/14 |
| 5,859,866 A | 1/1999 | Forrest et al. | 372/50 |
| 5,917,967 A | 6/1999 | Dubey et al. | 385/14 |
| 5,985,685 A | 11/1999 | Lealman et al. | 438/31 |
| 6,031,851 A | 2/2000 | Shimizu et al. | 372/18 |
| 6,051,445 A | 4/2000 | Dubey et al. | 438/31 |
| 6,167,073 A | 12/2000 | Botez et al. | 372/46 |
| 6,198,863 B1 | 3/2001 | Lealman et al. | 385/37 |
| 6,215,295 B1 | 4/2001 | Smith, III | 324/95 |
| 6,240,233 B1 | 5/2001 | Weinert et al. | 385/131 |
| 6,246,965 B1 | 6/2001 | Cockerham et al. | 702/85 |
| 6,310,995 B1 | 10/2001 | Saini et al. | 385/28 |
| 6,311,003 B1 | 10/2001 | Dubey et al. | 385/130 |
| 6,314,451 B1 | 11/2001 | Landsman et al. | 709/203 |
| 6,330,378 B1 | 12/2001 | Forrest et al. | 385/14 |
| 6,330,387 B1 | 12/2001 | Salamon et al. | 385/129 |
| 6,335,994 B1 | 1/2002 | Kato | 385/50 |
| 6,339,496 B1 | 1/2002 | Koley et al. | 359/344 |
| 6,381,380 B1 | 4/2002 | Forrest et al. | 385/14 |
| 6,483,863 B2 * | 11/2002 | Forrest et al. | 372/50.21 |
| 6,490,044 B1 * | 12/2002 | Koch et al. | 356/478 |
| 6,519,374 B1 | 2/2003 | Stook et al. | 385/2 |
| 6,668,103 B2 * | 12/2003 | Hosoi | 385/2 |
| 6,795,622 B2 | 9/2004 | Forrest et al. | 385/50 |
| 6,819,814 B2 | 11/2004 | Forrest et al. | 385/14 |
| 2002/0018504 A1* | 2/2002 | Coldren | 372/50 |
| 2002/0031297 A1 | 3/2002 | Forrest et al. | 385/28 |
| 2002/0097941 A1 | 7/2002 | Forrest et al. | 385/1 |
| 2003/0012244 A1 | 1/2003 | Krasulick et al. | 372/50 |
| 2004/0096175 A1 | 5/2004 | Tolstikhin | 385/131 |

FOREIGN PATENT DOCUMENTS

| | | |
|---|---|---|
| EP | 0 263 640 | 4/1988 |
| FR | 2 337 449 | 7/1977 |
| GB | 2 105 863 A | 3/1983 |
| JP | 2000-228558 | 8/2000 |
| WO | WO 99/67665 | 12/1999 |
| WO | WO 03/007057 A2 | 1/2003 |
| WO | WO 03/102678 A1 | 12/2003 |

OTHER PUBLICATIONS

Forrest, S.R., et al., "Integrated photonics using asymmetric twin-waveguide structures," *IEEE*, 2000, 13-16.

Shi, H., et al., "Relative intensity noise measurements of a widely tunable sampled-grating DBR laser," *IEEE Photonics Techn. Letts.*, 2002, 14, 759-761.

Alferness, R.C., et al., "Vertically coupled INGAASP/INP buried rib waveguide filter," *Applied Physics Letts.*, 1991, 59(20), 2573-2575.

Bach, L., et al., "Wavelength stabilized single-mode lasers by coupled micro-square resonators," *IEEE Photonics Techn. Lett.*, 2003, 15(3), 377-379.

Bauer, J.G., et al., "High responsivity integrated tapered waveguide PIN photodiode," *Proceedings fo the European Conference on Optical Communication (ECOC)*, Sep. 12-16, 1993, vol. 2, Conf. 19, 277-280.

Bennett, S., et al., "1.8-THz bandwidth, zero-frequency error, tunable optical comb generator for DWDM applications," *IEEE Photonics Techn. Letts.*, 1999, 11(5), 551-553.

Brückner, H.J., et al., "Taper-Waveguide integration for polarization insensitive InP/InGaAsP based optical amplifiers," *Electron. Lett.*, 1994, 30(16), 1290-1291.

Claassen, A., et al., "Comparison of diodes and resistors for measuring chip temperature during thermal characterization of electronic packages using thermal test chips," *IEEE 18th Ann. Semiconductor Thermal Measurement & Management Symposium*, 1997, 198-209.

"Coupled cavity modelocked lasers," *Applied Physics*, http://fb6www.uni-paderborn.de, downloaded Mar. 30, 2005, 3 pages.

"Current work on composite-resonator vertical-cavity lasers," *Coupled Cavity VCSELs*, http://vcsel.micro.uiuc.edu, downloaded Mar. 30, 2005, 4 pages.

Dagenais, M., et al., "Alignment tolerant lasers and silicon waferboard integration," *Passive Alignment Techniques for Optoelectronic Transmitter Arrays*, http:www.ee.umd.edu/photonics/papers/spie/SPIE97.htm, 1997, 6 pages.

Dagenais, M., et al., "Complex needs drive optoelectronic integration," *Optoelectronics World*, Jul. 1998, 157-160.

den Besten, J.H., et al., "An integrated coupled-cavity 16-wavelength digitally tunable laser," *IPR*, 2002, 1-3.

Fredkin, E., et al., "Conservative Logic," *Int. J. Theor. Phys.*, 1982, 21(3/4), 219-253.

Gokhale, M.R., et al., "Uncooled, 10Gb/s 1310 nm electrobsorption modulated laser," presented at OFC 2003 (PD-42), Atlanta, USA, 2003, 4 pages.

Hamamoto, K., et al., "Insertion-loss-free 2×2 InGaAsP/InP optical switch fabricated using bandgap energy controlled selective MOVPF," *Electron. Lett.*, 1995, 31(20), 1779-1781.

Hammond, B., et al., "Integrated wavelength locker for tunable laser applications," *15th Ann. Meeting of the IEEE Lasers and Electro-Optics Soc.*, 2002, 2, 479-480.

He, J.-J., et al., "Photonic integrated circuits and components using quantum well intermixing," *Integrated Optoelectronics, Proc. of SPIE*, 1996, 2891, 2-9.

Johnson, J.E., et al., "Fully stabilized electroabsorption-modulated tunable DBR laser transmitter for long-haul optical communications," *IEEE J. on Selected Topics in Quantum Electronics*, 2001, 7(2), 168-177.

Kanjamala, A.P., et al., "Wavelength switching in multicavity lasers," *Am. Inst. Of Physics*, 1997, 71(3), 300-302.

Newkirk, M.A., et al., "1.55 µm multiquantum well semiconductor optical amplifier with low gain ripple and high coupling efficiency for photonic circuit integration," *Electron. Lett.*, 1993, 29(5), 443-444.

O'Dowd, R., et al., "Frequency plan and wavelength switching limits for widely tunable semiconductor transmitters," *IEEE J. Selected Topics in Quantum Electronics*, 2001, 7(2), 259-269.

Oh, K.R., et al., "2×2InGaAsP/InP laser amplifier gate switch arrays using reactive ion etching," *Electron. Lett.*, 1996, 32(1), 39-40.

Rabus, D.G., et al., "MMI-coupled ring resonators in GaInAsP—InP," *IEEE Photonics Techn. Letts.*, 2001, 13(8), 812-814.

Rabus, D.G., et al., "Resonance frequency tuning of a double ring resonator in GaInAsP/InP: experiment and simulation," *Jpn. J. Appl. Phys.*, 2002, 41, 1186-1189.

Rabus, D.G., et al., "High-Q channel-dropping filters using ring resonators with integrated SOAs," *IEEE Photonics Techn. Letts.*, 2002, 14(10), 1442-1444.

Saini, S.S., et al., "Compact mode expanded lasers using resonant coupling between a 1.55-µm InGaAsP tapered active region and an underlying coupling waveguide," *IEEE Photonics Technology Letters*, 1998, 10(9), 1232-1234.

Saini, S.S., et al., "Compact low-loss vertical resonant mode coupling between two well-confined waveguides," *Electronics Letts.*, 1999, 35(14), 2 pages.

Saini, S.S., et al., "Passive active resonant coupler (PARC) platform with mode expander," *IEEE Photonics Techn. Letts.*, 2000, 12(8), 1025-1027.

Sarlet, G., et al., "Control of widely tunable SSG-DBR lasers for dense wavelength division multiplexing," *IEEE J. Lightwave Techn.*, 2000, 18(8), 1128-1138.

Shi, H.., et al., "Relative intensity noise measurements of a widely tunable sampled-grating DBR laser," *IEEE Photonics Techn. Letts.*, 2002, 14(2), 759-761.

Silva, C.F.C., et al., "A dense WDM source using optical frequency comb generation and widely tunable injection-locked laser filtering techniques," *Dept. of Electronics & Electrical Eng.*, year not available, 4 pages.

Studenkov, P.V., et al., "Asymmetric Twin-Waveguide 1.55-µ Wavelength Laser with a Distributed Bragg Reflector", *IEEE Photonics Technology Letters*, 2000, 12(5), 468-470.

Studenkov, P.V., et al., "Monolithic integration of a quantum-well laser and an optical amplifier using an asymmetric twin-waveguide structure," *IEEE Photonic Technol. Lett.*, 1998, 10(8), 1088-1090.

Studenkov, P.V., et al., "Efficient coupling in integrated twin-waveguide lasers using waveguide tapers," *IEEE Photonics Technol. Lett.*, 1999, 11(9), 1096-1098.

Studenkov, P.V., et al., "Monolithic integration of an all-optical mach-zehnder demultiplexer using an asymmetric twin-waveguide structure," *IEEE Photonics Technol. Lett.*, 2001, 13(6), 600-602.

Suematsu, Y., et al., "Integrated twin-guide AlGaAs laser with multiheterostructure," *IEEE J. Quantum Electron.*, 1975, QE-11(7), 457-460.

Tatsuno, K., et al., "50 GHz spacing, multi-wavelength tunable locker integrated in a transmitter module with a monolithic-modulator and a DFB-laser," *2001 Optical Fiber Commun. Conf.*, 2001, Tub5-1-Tub5-4.

Utaka, K., et al., "Measurement of coupling coefficient and coupling length of GaAs/AlGaAs integrated twin-guide injection lasers prepared by liquid-phase epitaxy," *Trans. IECE Japan*, 1979, E-62, 319-323.

Van, V., et al., "Optical singal processing using nonlinear semiconductor microring resonators," *IEEE J. on Selected Topics in Quantum Electronics*, 2002, 8(3), 705-713.

Vusirikala, V., et al., "1.55- µm InGaAsP—InP laser arrays with integrated-mode expanders fabricated using a single epitaxial growth," *IEEE J. Selected Topics in Quantum Electronics*, Dec. 1997, 3(6), 1332-1343.

Vusirikala, V., et al., "Compact mode expanders using resonant coupling between a tapered active region and an underlying coupling waveguide," *IEEE Photonics Techn. Letts.*, 1998, 10(2), 203-205.

Wang, H., et al., "A fully integratable 1.55-µm wavelength, continuously tunable asymmetric twin-waveguide distributed bragg reflector laser," *IEEE Photonics Technol. Lett.*, 2003, 15(9), 1189-1191.

Wei, J., et al., "A high-responsivity high-bandwidth asymmetric twin-waveguide coupled InGaAs—InP—InAlAs avalanche photodiode," *IEEE Photonics Technol. Lett.*, 2002, 14, 1590-1592.

Woodward, S.L., et al., "RIN multisection MQW-DBR lasers," *IEEE Photonics Tech. Letts.*, 1990, 2(2), 104-108.

Woodward, S.L., et al., "A control loop which ensures high sidemode-suppression ratio in a tunable DBR laser," *IEEE Photonics Techn. Letts.*, 1992, 4(5), 417-419.

Xia, F.N., et al., "Monolithic integration of a semiconductor optical amplifier and a high bandwidth p-i-n photodiode using asymmetric twin-waveguide technology," *IEEE Photonics Technol. Lett.*, 2003, 15(3), 452-454.

Xu, L., et al., "Monolithic integration of an InGaAsl'—InP MQW laser/waveguide using a twin-guide structure with a mode selection layer," *IEEE Photon. Technol. Lett.*, 1997, 9(5), 569-571.

Yokoyama, Y., et al., "Multiwavelength locker integrated wide-band wavelength-selectable light source module," *IEEE Photonics Techn. Letts.*, 2003, 15(2), 290-292.

Huang, Y., et al., "Reduction of absorption loss in asymmetric twin waveguide laser tapers using argon plasma-enhanced quantum-well intermixing," *IEEE Photonics Techn. Letts.*, 2004, 16(10), 2221-2223.

* cited by examiner

MONOLITHIC WAVELENGTH STABILIZED ASYMMETRIC LASER

CROSS REFERENCE TO RELATED APPLICATIONS

The present application is related by subject matter and claims priority to U.S. provisional patent application No. 60/562,008 entitled "Wavelength Locker For WDM Transmitter Using Integrated Micro-Ring/Disk Resonators With Balanced Photodiodes" filed on Apr. 14, 2004, the contents of which are hereby incorporated by reference in its entirety.

GOVERNMENT LICENSE RIGHTS

The U.S. Government may have a paid-up license in the subject matter claimed herein and the right in limited circumstances to require the patent owner to license others on reasonable terms as provided for by the terms of Contract Number DAAD17-02-C-0099 with the United States Air Force.

FIELD OF THE INVENTION

The present application relates to the field of optical communications, and more particularly to integrated photonic devices.

BACKGROUND

In a dynamic wavelength division multiplexing ("WDM") network, unintended changes or "drift" to the wavelength of a transmitter component can result in severe signal degradation and network disruption. In order to avoid wavelength drift, transmitter components may be monitored for changes to operational characteristics including wavelength, output power, side-mode suppression ratio (SMSR) and relative intensity noise (RIN).

Existing systems for monitoring output signals from tunable lasers typically employ a complicated electronics circuit that monitors the output of a single resonator device to identify a shift in signal wavelength. Also, existing systems are typically formed from non-monolithic discrete components. FIG. 1 provides a diagram depicting an existing wavelength stabilization system or wavelength locker. As shown in FIG. 1, existing wavelength lockers comprise lens 110, beam splitter 112, etalon 114, and photodiodes 116, 118. Lens 110 collimates light emerging from a transmitter (not shown) before it is divided into two paths by beam splitter 112. One light path contains photodiode 116 which is used to monitor laser power. The second light path consists of etalon 114 and remaining photodiode 118 which are used to monitor laser signal wavelength. Etalon 114 has a periodic transmission characteristic designed to correspond to the WDM channel spacing. Variations in the signal intensity emerging from etalon 114 indicate a change in laser wavelength. An electronic feedback control loop (not shown) monitors the output from photodiode 118 and adjusts the transmitter parameters such as current, temperature, etc. so as to maintain the desired wavelength output.

In existing stabilization systems such as that depicted in FIG. 1 wherein a single wavelength monitoring device—etalon 114—is employed to identify a peak in the output signal, a complicated electronic feedback control loop is required to interpret the etalon output and determine what feedback steps should be taken to arrive at the desired wavelength.

Also, existing wavelength stabilization systems typically consist of separate and non-monolithic components. Such systems often have a relatively large form factor in order to accommodate the several discrete components. Production of wavelength stabilization systems from discrete components involves the additional complexity of aligning components on a submount and fixing the components in place. Indeed, existing stabilization systems are often subject to inaccuracies and instabilities resulting from imperfections in the alignment of discrete components. Moreover, the additional efforts directed at attempting to align components greatly increases the costs of manufacturing existing wavelength stabilizing devices.

SUMMARY

Applicants disclose herein novel monolithic wavelength stabilized laser systems and methods for operating such systems.

An illustrative system comprises a laser that is monolithically formed with a waveguide splitter having at least two branches. Non-identical resonators having different wavelengths are operatively coupled to each branch of the splitter and a photodiode is communicatively coupled to receive the output from each non-identical resonator. The laser, splitter, resonators, and photodiodes are monolithically formed in a single chip using asymmetric waveguides. Thus, the components are fabricated from vertically stacked waveguides that have different effective refractive indices, and the modes of light that propagate in the waveguides are divided unequally between the waveguides in the areas that the waveguides overlap.

In an illustrative embodiment, the laser output is divided by the splitter so as to create a first signal portion in a first branch of the splitter and a second signal portion in a second branch of the splitter. A first non-identical resonator filters the first signal portion propagating in the first splitter branch. A second non-identical resonator filters the second signal portion propagating in the second splitter branch. Each of the filtered signals are coupled into a separate photodiode. The photocurrents from the photodiodes, either as separate signals, or as a composite signal are transmitted to a control unit. The composite value, which may comprise, for example the difference between the photocurrent outputs from the photodiodes associated with each branch of the splitter, may be used by a control unit to determine whether the laser output is at the desired wavelength. In an illustrative embodiment, where the difference in the photocurrent output from the photodiodes is substantially zero, the laser output is determined to have the desired wavelength. Where the difference in photocurrents from the photodiodes is not at the desired level, the control unit controls the laser to modify the laser output so as to bring the output closer to the desired wavelength as dictated by the outputs at the photodiodes. In an illustrative embodiment, the control unit sends control signals to tunable portions of the laser such as, for example, a tunable phase section and/or tunable grating, to effect the wavelength of the laser output signal.

Applicants disclose an illustrative wavelength stabilization system for use with a coupled cavity mode locked laser. In the illustrative embodiment, the mode locked laser is monolithically formed with a waveguide splitter having at least three branches. Non-identical resonators having different wavelengths are operatively coupled to each branch of the splitter and a photodiode is communicatively coupled to receive the output from each non-identical resonator. The laser, splitter, resonators, and photodiodes are monolithically formed in a single chip comprising asymmetric waveguides.

In the illustrative embodiment, the laser output is divided by the splitter so as to create a first signal portion in the first branch of the splitter, a second signal portion in the second branch of the splitter, and a third signal portion in the third branch of the splitter. A first of the non-identical resonators filters the first signal portion propagating in the first splitter branch. A second of the non-identical resonators filters the second signal portion propagating in the second splitter branch. And a third of the non-identical resonators filters the third signal portion propagating in the third splitter branch. Each of the filtered signals are coupled into a separate photodiode. The photocurrents from the photodiodes, either as separate signals, or as a composite signal are transmitted to a control unit. The composite value, which may comprise the differences between the photocurrent outputs from photodiodes associated with successive branches of the splitter, is used by a feedback control unit to determine whether the laser output is at the desired wavelength. The illustrative system operates on the principle that when the laser is operating at the desired wavelengths, two wavelengths of the mode locked laser frequency comb are positioned at the midpoints between the wavelengths of the successive resonators. When the first two wavelengths of the mode locked laser frequency comb are positioned at the midpoints between the resonant wavelengths of the successive resonators, the photocurrents from the corresponding successive resonators are substantially equal. Where the difference in photocurrents from the photodiodes from successive branches of the splitter is not at the desired level, a control unit communicates with the laser to modify its output so as to bring the output closer to the desired wavelengths.

BRIEF DESCRIPTION OF THE DRAWINGS

FIG. 10a provides a perspective view of an illustrative coupled cavity tunable locked laser;

FIG. 10b provides a sectional view of the illustrative coupled cavity tunable locked laser of FIG. 10a;

DETAILED DESCRIPTION OF ILLUSTRATIVE EMBODIMENTS

Figure 1:
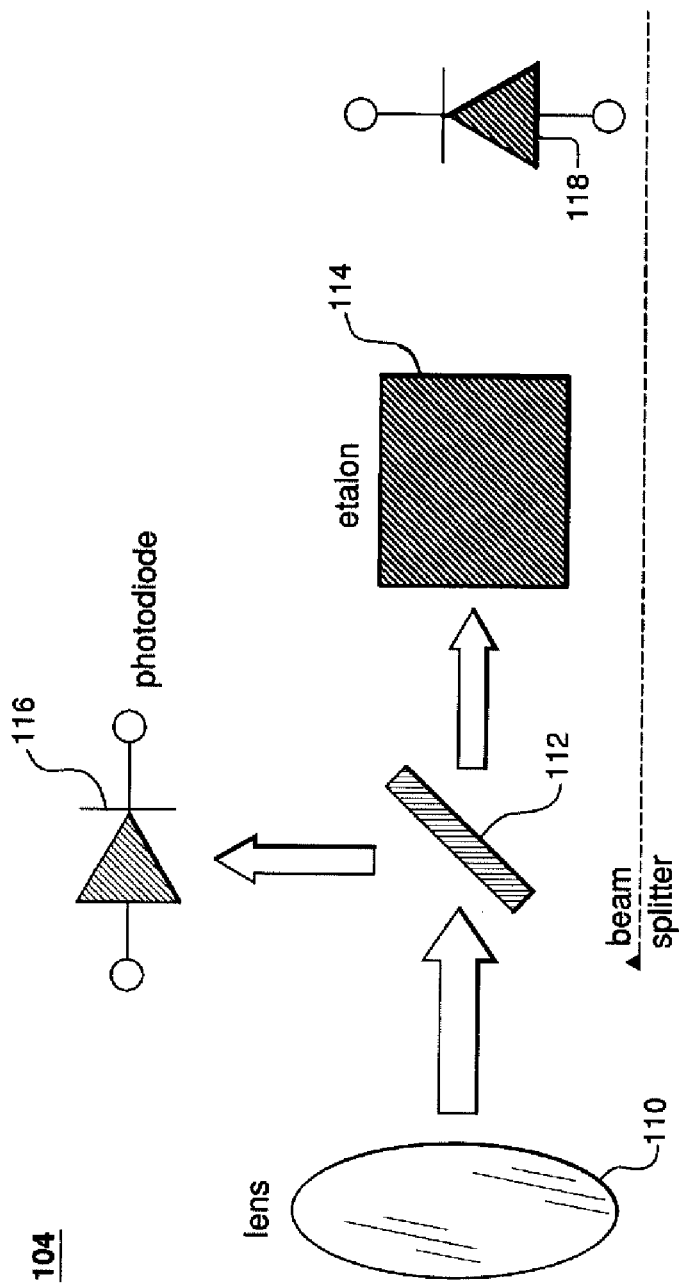
FIG. 1 depicts a non-monolithic wavelength stabilization system.
Figure 2:
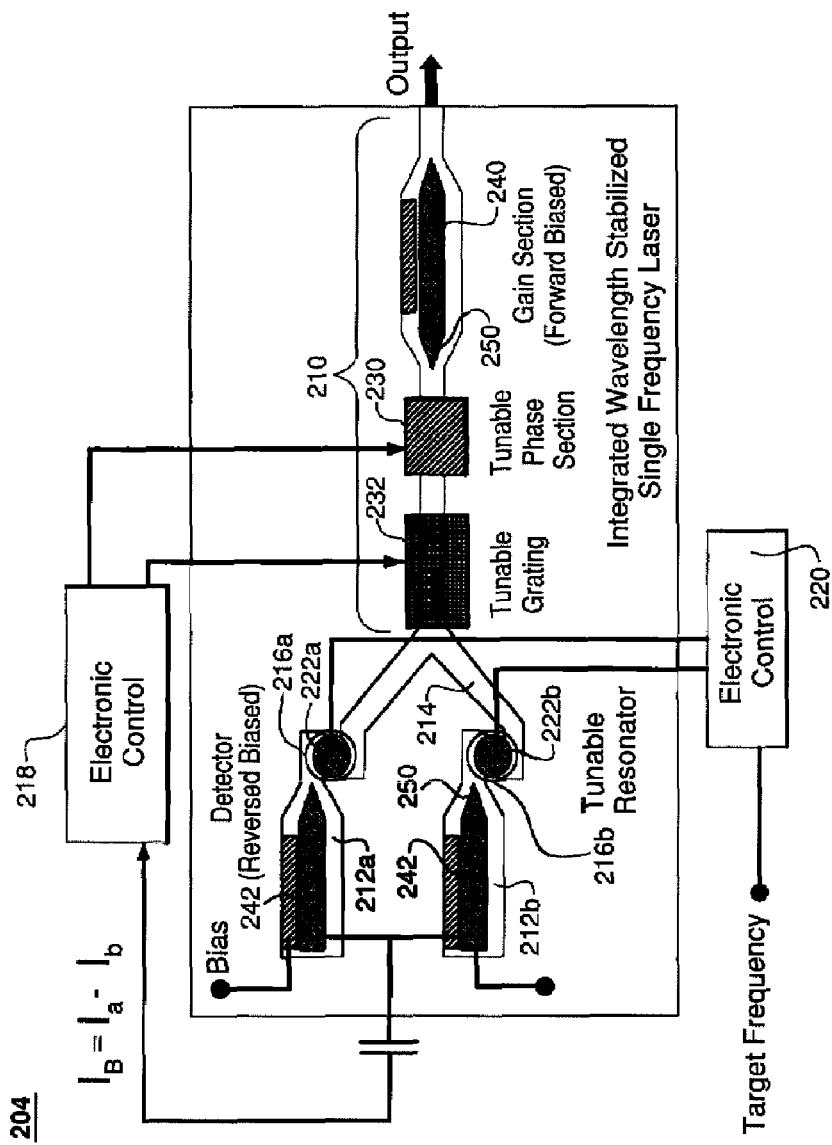
FIG. 2 depicts an illustrative wavelength stabilized tunable laser system.

FIG. 2 is a diagram depicting an illustrative embodiment of a novel integrated wavelength stabilized tunable laser system 204. The illustrative embodiment comprises a three section distributed bragg resistance (DBR) laser 210 that is coupled via splitter 214 and non-identical resonators 216a, 216b to two photodiode detectors 212a, 212b. DBR laser 210, detectors 212, splitter 214, and resonators 216a, 216b are formed on a single chip and are integrated using asymmetric waveguides as disclosed in U.S. Pat. No. 6,381,380 entitled "Twin Waveguide Based Design For Photonic Integrated Circuits" the contents of which are hereby incorporated by reference in its entirety. System 204 further comprises electronic control 218 which monitors the output of photodiodes 212a, 212b and adjusts laser 210 to stabilize the laser output to a desired wavelength. The laser system also comprises metal resistors or deposits 222a, 222b and corresponding control 220 that are employed in tuning the system to a desired wavelength.

Figure 3:
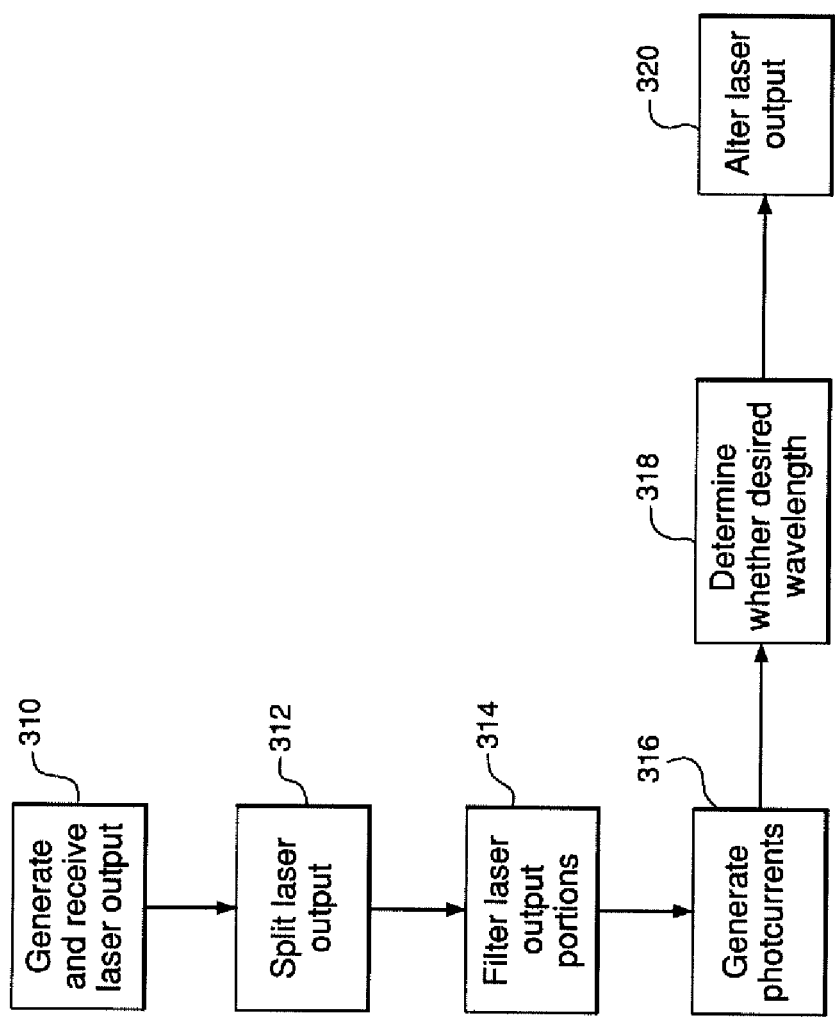
FIG. 3 depicts a flow of processing in an illustrative wavelength stabilized tunable laser system.

FIG. 3 is a diagram of the flow processing in an illustrative system. As shown, at step 310, an output signal is generated at laser 210 and received at splitter 214, which may be, for example, a 50:50 multimode interface ("MMI") coupler. At step 312, splitter 214 splits the signal into substantially equal signal portions, and each signal portion propagates in a separate branch of splitter 214. At step 314, tunable resonators 216a, 216b, each of which are operatively coupled to a separate branch of splitter 214, filter the signal portions propagating in the branches of splitter 214. Photodiode detectors 212a, 212b are integrally formed with resonators 216a, 216b respectively. At step 316, the output from resonators 216a, 216b results in a photocurrent being generated by the respective photodiode detectors 212a, 212b. The photocurrent outputs from photodiode detectors 212a, 212b are represented by $I_a$ and $I_b$ respectively in FIG. 2. At step 318, control unit 218 receives the photocurrent outputs or a composite signal corresponding to the photocurrent outputs and determines whether the wavelength of the laser output is at the desired value. The composite value may comprise, for example, a difference between the photodiode detectors. At step 320, control unit 218 transmits signals to laser 210 to alter the output of the laser. For example, if control unit 218 determines using, for example, the composite value, that the wavelength of the output is too large, control unit 218 transmits signals to laser 210 that causes the laser output wavelength to become smaller.

Figure 4:
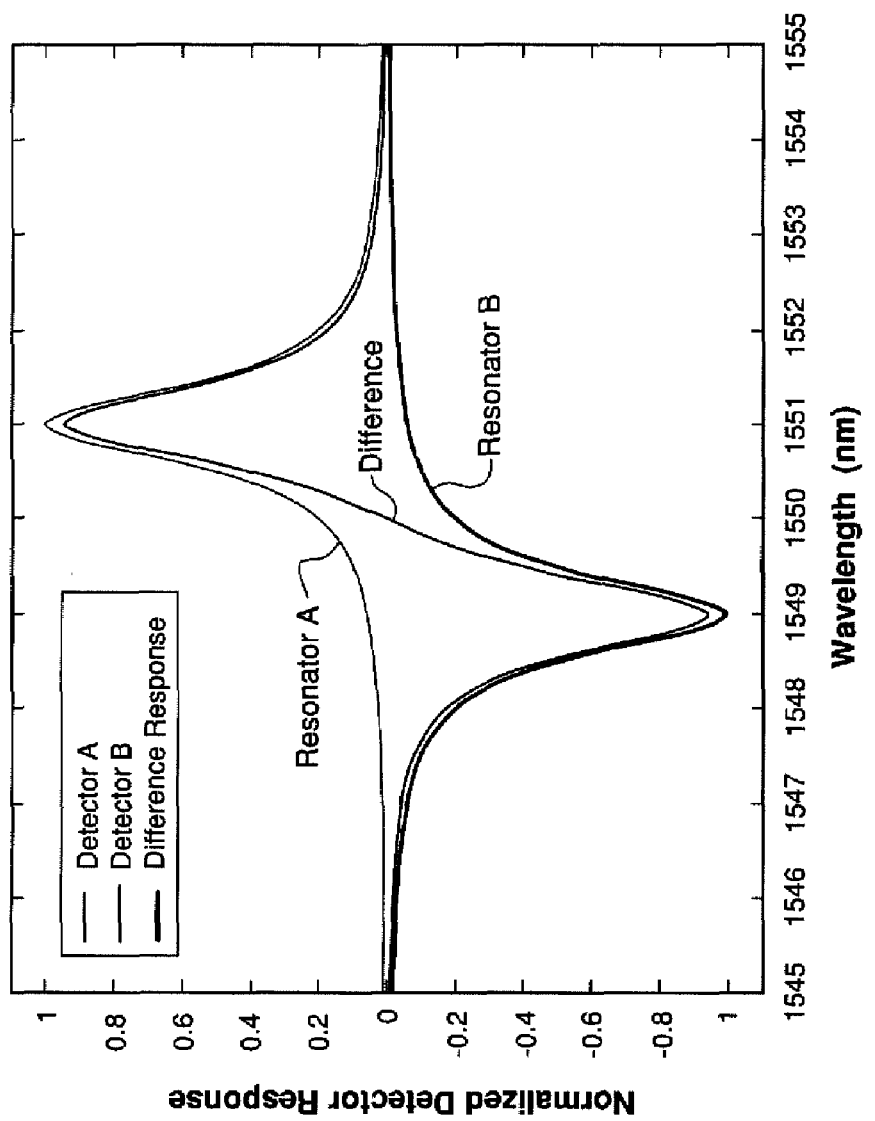
FIG. 4 depicts a graph showing normalized photo detector responses and the difference between the responses as a function of resonator wavelengths.

Referring back to the illustrative embodiment of FIG. 2, resonators 216a, 216b have different lengths which causes the respective wavelengths, $\lambda_a$ and $\lambda_b$, of the resonators 216 to be slightly different. When laser 210 is operating as desired, the wavelength $\lambda_0$ of the output from laser 210 is positioned at the midpoint between the resonant wavelengths ($\lambda_a$ and $\lambda_b$) of resonators 216a, 216b. FIG. 4 depicts the normalized photo detector responses and the difference between the responses as a function of wavelengths for resonators 216a, 216b. When $\lambda_0$ is at the midpoint between $\lambda_a$ and $\lambda_b$, the photocurrents $I_a$ and $I_b$ from photodiode detectors 212 are equal ($I_a=I_b$). However, a shift in wavelength $\lambda_0$ of the output from laser 110 causes the difference, $I_{Diff}$, between photocurrents, $I_a-I_b$, to increase, i.e. become non-zero. An increasing value for $I_{Diff}$ signals to control unit 218 that the wavelength $\lambda_0$ of the laser output signal may have "drifted" from the desired value. Moreover, the value of $I_{Diff}$, and specifically whether it is a positive or negative number, delineates which direction the wavelength of the laser output should be adjusted in order to arrive at the desired value.

Figure 5:
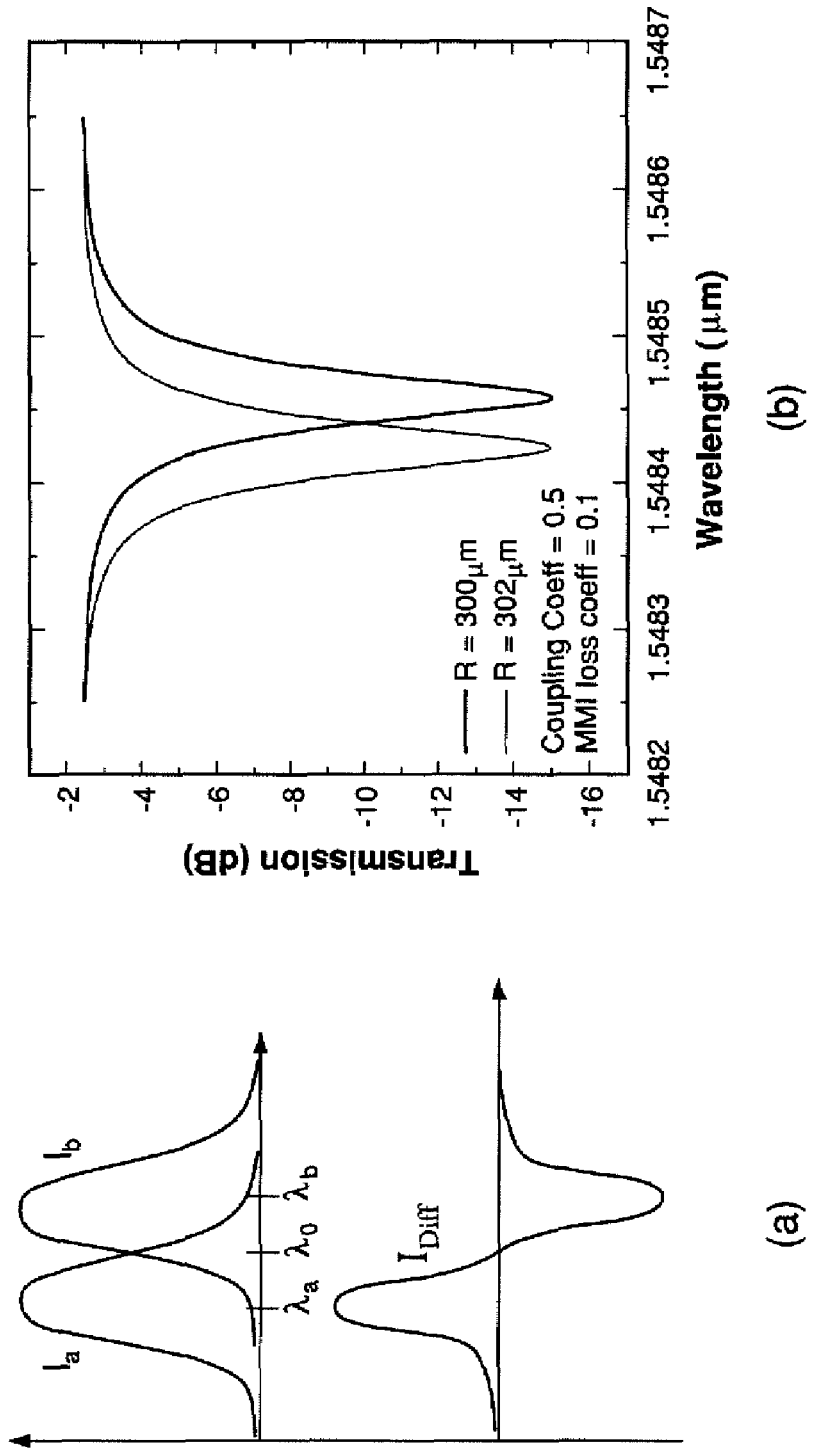
FIG. 5a depicts the desired location of the expected laser signal wavelength for the illustrative system shown in FIG. 2.
FIG. 5b depicts normalized responses for varying resonator wavelengths.

The photocurrent outputs or a composite signal corresponding to the photocurrent outputs is fed to control circuit 218. In an illustrative embodiment, the composite value may comprise, for example, the difference $I_{Diff}$, between the photocurrent outputs. Control circuit 218 operates to minimize $I_{Diff}$ by controlling tunable phase section 230 and tunable grating section 232 of laser 210 to stabilize the laser wavelength at a value $\lambda_0$ between $\lambda_a$ and $\lambda_b$ where the coupling efficiencies between the two resonators 216a, 216b are equal. FIG. 5a depicts the location of $\lambda_0$ between $\lambda_a$ and $\lambda_b$. FIG. 5b depicts resonator responses for varying resonator wavelengths.

Control circuit 218 may comprise, for example, an integrator and a translator. The input to the integrator function of circuit 218 may be the error between the target and the actual laser frequency. For large open loop gain, the integrator output corresponds to the target frequency to which the laser is to be stabilized/locked. The translator portion of circuit 218 converts the integrator output into two signals—one for the tunable grating and one for the tunable phase section. The translator may be implemented as, for example, a look up table (LUT) which can be used to convert target frequency input into tuning signals for tunable phase section 230 and tunable grating mirror 232. Although the translation circuit could alternatively be an appropriately designed passive circuit, an embodiment using a LUT has an additional advantage of being programmable and thereby allowing for a "learning phase" to account for variations in the integrated photonic components.

The illustrative laser system 204 can be tuned to a desired wavelength. Generally, this is accomplished by altering the refractive index of resonators 216a, 216b which has the effect of changing in the wavelengths $\lambda_a$ and $\lambda_b$ of resonators 216a, 216b. Altering the resonator wavelengths $\lambda_a$ and $\lambda_b$ changes the midpoint between these two wavelengths which, as described above, represents the desired wavelength for the laser output. Thus, the laser system can be "tuned," i.e. a desired laser output wavelength selected, by changing the refractive index of resonators 216a, 216b. Changing the refractive index of resonators 216a, 216b can be accomplished by any suitable means such as, for example, current induced plasma loading, voltage induced Franz-Keldysh effect, quantum confined Stark effect, adding current, and heating effect. In an illustrative embodiment, metallic deposits 222a, 222b, which are controlled by electronic control 220, may be used to add heat to the system as required to control the temperature of resonators 216a, 216b and thereby control the refractive index of the resonator.

Figure 6:
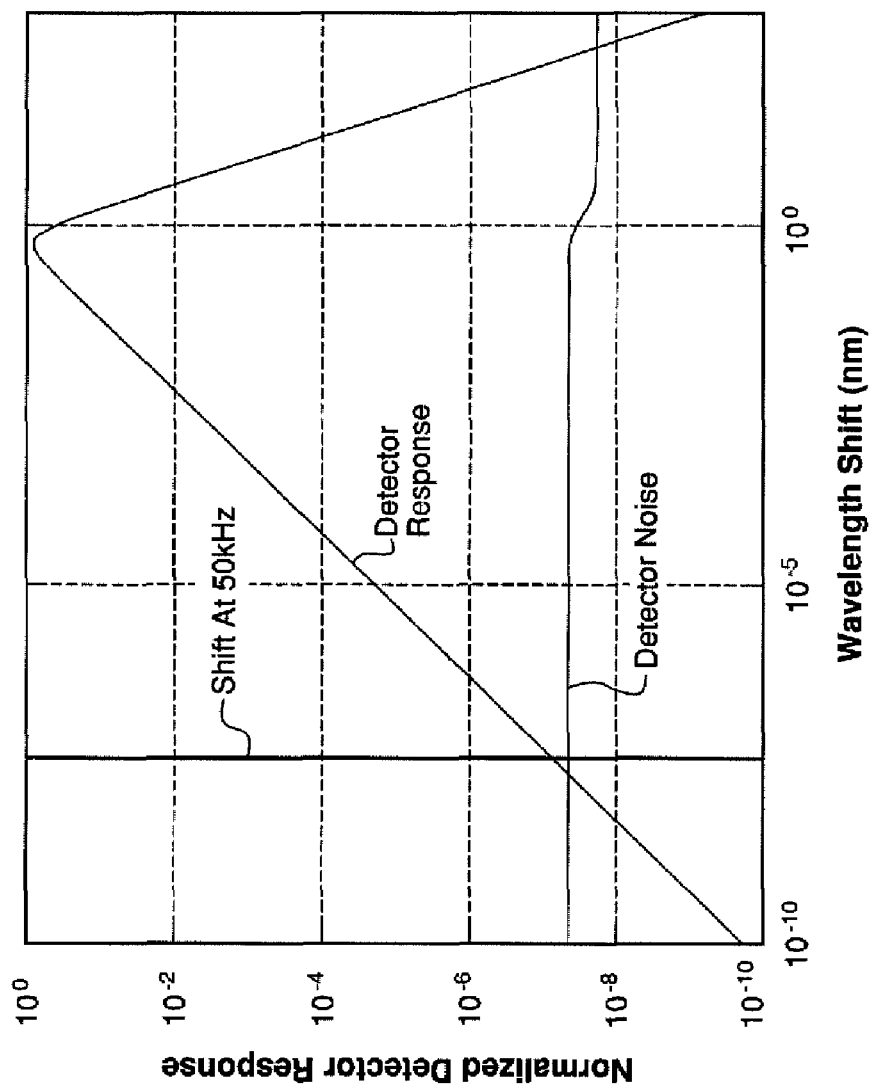
FIG. 6 depicts normalized detector responses as a function of wavelength shift.

In an illustrative embodiment, a wavelength stability of at least less than 50 kHz may be achieved. The wavelength stability of laser 210 may be defined by the wavelength shift at which the detector signal equals the detector noise, wherein detector noise comprises shot noise and thermal noise. FIG. 6 depicts normalized detector response as a function of wavelength shift. The target wavelength, detector noise, and wavelength shift corresponding to 50 kHz are depicted. As shown in FIG. 6, in an illustrative embodiment, the wavelength stability which is represented by the intersection of the detector signal and the detector noise is at least less than 50 kHz.

Laser 210, splitter 214, resonators 216a, 216b, and photodiode detectors 212a, 212b are formed in a monolithic chip using asymmetric waveguide techniques as disclosed in U.S. Pat. No. 6,381,380 entitled "Twin Waveguide Based Design For Photonic Integrated Circuits." Generally, asymmetric waveguide designs involve evanescently coupled, vertically stacked waveguides with slightly different propagation constants that can be grown in a single epitaxial step. The vertically stacked waveguides have different effective refractive indices, and the modes of light that propagate in the waveguides are divided unequally between the waveguides in the areas that the waveguides overlap. Laterally tapered couplers are used to provide low-loss, reflection-free vertical transfer of optical power between waveguides.

Figure 7:
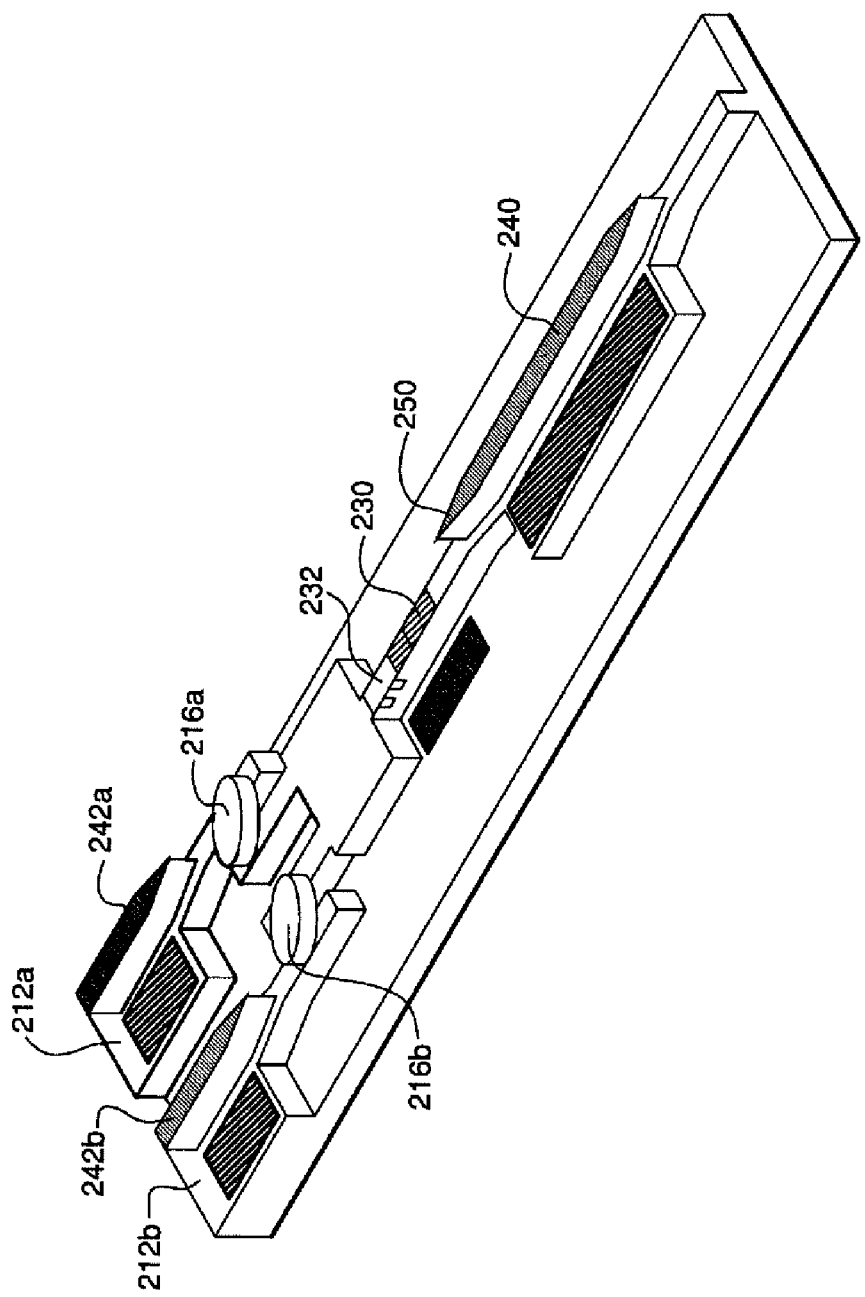
FIG. 7 is a perspective view of the illustrative wavelength stabilized tunable laser system of FIG. 2.

FIG. 7 provides a perspective view of the illustrative stabilized laser system of FIG. 2. In the illustrative system, laser 210, splitter 214, resonators 216a, 216b, and photodiode detectors 212a, 212b are formed in a three level asymmetric waveguide circuit. A top level has a waveguide gain section 240 of laser 210 formed therein which contains quantum wells that are forward biased. The top level also has formed therein reversed bias regions 242 of photodiode detectors 212. A second level of the waveguide circuit, which is formed below the top level, has tunable grating section 232 and tunable phase section 230 of DBR laser 210 formed therein. The second waveguide level further has formed therein splitter 214 and resonators 216. A bottom waveguide level has quantum wells formed therein that comprise modulator 244 (not shown) of laser 210. The waveguide components are formed so that different modes of light that propagate in the chip are divided unequally between the waveguides. Lateral tapers 250 are strategically formed in the waveguides to facilitate the movement of power between the waveguides. The circuit elements comprised in system 204 are electrically isolated from each other using, for example, ion implantation.

Laser 210 comprises active gain section 240, tunable phase section 230, back tunable grating mirror 232, and modulator 244 (not shown). Laser 210 may be any of numerous different types of lasers such as, for example, a DBR single frequency laser. Gain section 240 is formed in the top waveguide level, tunable phase section 230 and back tunable grating 232 are formed in the middle waveguide level, and modulator 244 is formed in the bottom waveguide level. The waveguide components are designed so as to have different effective indices of refraction. Thus, the active gain section 240 has a higher effective index of refraction than the middle level waveguide below it. Modes of light having different indices of refraction are divided unevenly between the waveguides in the areas where the waveguides overlap. For example, the mode of light that propagates primarily in active gain section 240 has a different effective index of refraction than the mode of light that propagates primarily in the middle level waveguide in which tunable phase section 230 and grating mirror 232 are formed. Likewise, the mode of light propagating primarily in the middle level waveguide comprising tunable phase section 230 and grating mirror 232 has a different effective index of refraction than the mode of light propagating primarily in the lower level waveguide in which modulator 244 is formed.

Splitter 214 is also formed in the middle waveguide level. Thus, light propagating in the middle waveguide level, after passing through tunable phase section 230 and tunable grating section 232 is divided by splitter 214.

Figure 8:
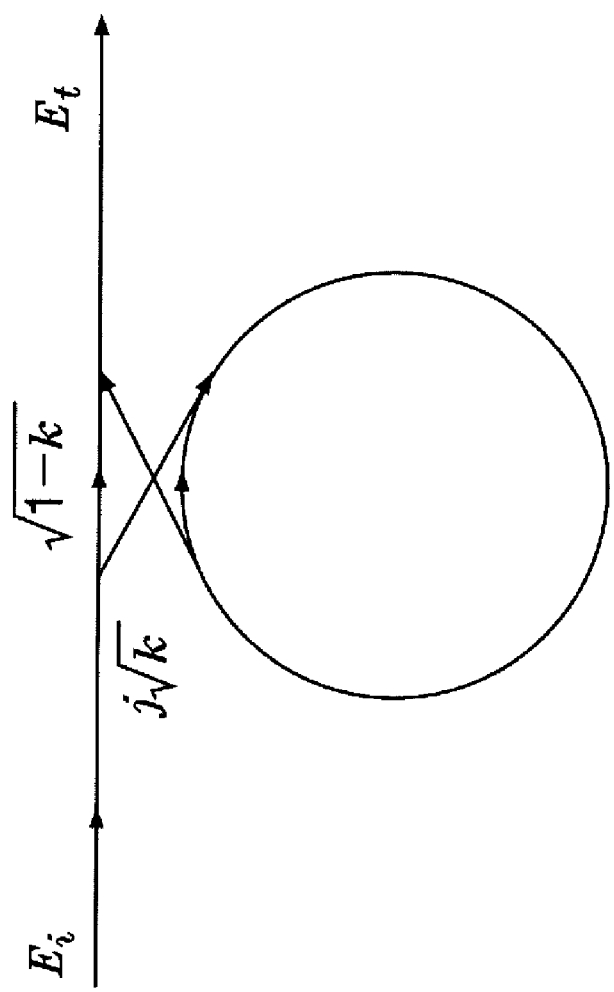
FIG. 8 depicts the signal flow in a ring resonator.

Resonators 216a, 216b are also formed in the middle waveguide level. Resonators 216a, 216b may be any type of suitable resonating device, for example, disk resonators, ring resonators, grating co-directional couplers, and combinations thereof. In an illustrative embodiment, resonators 216a, 216b have a spectral width of 1 nm and have resonance peaks that are offset by 2 nm. Resonators 216a, 216b are monolithically integrated with semiconductor laser 210 and provide filter characteristics suited to a wavelength locker as disclosed in, for example, "MMI-Coupled Ring Resonators in GaInAsP—InP," IEEE Photonics Technology Letters, Volume 13, pp. 812–814, 2001 and "Wavelength Stabilized Single-Mode Lasers By Coupled Micro-Square Resonators," IEEE Photonics Technology Letter, Volume 15, pp. 377–379, 2003, the contents of which are hereby incorporated by reference in their entirety. Light is coupled into ring resonators 216a, 216b from an adjacent optical waveguide formed in splitter 214 using any of several suitable structures including, for example, a multimode interference (MMI) coupler, a conventional directional coupler, or a vertical coupler, as disclosed in, for example, "Resonance Frequency Tuning Of A Double Ring Resonator in GaInAsP/InP: Experiment and Simulation," Jpn. J. Appl. Phys., Vol. 41, pp. 1186–89, 2002, and "Optical Signal Processing Using Nonlinear Semiconductor Microring Resonators," IEEE Journal on Selected Topics in Quantum Electronics, Volume 8, pp. 705–13, 2003, the contents of which are hereby incorporated by reference in their entirety. FIG. 8 is a schematic diagram illustrating the signal flow in a an illustrative ring resonator, wherein the power coupling coefficient of the MMI, or directional coupler, is represented by κ. The transmission of the output intensity is given by the following equation:

$$\frac{I_t}{I_i} = \left|\frac{E_t}{E_i}\right|^2 = \left[1 - \frac{(1-x^2)\cdot(1-y^2)}{(1-x\cdot y)^2 + 4\cdot x\cdot y\cdot \sin^2\left(\frac{k\cdot L}{2}\right)}\right]$$

$$x = \exp(-\alpha\cdot L)$$

$$y = \sqrt{1-k}$$

$$k = \frac{2\pi n}{\lambda}$$

where κ is the power coupling coefficient, L represents the length of the ring resonator, α represents the loss coefficient of the ring, k is the wave propagation constant, n is the effective index, and λ is the signal wavelength. $E_t$ and $E_i$ are the transmitted and inserted electric fields. $I_t$ and $I_i$ are the transmitted and inserted field intensities, respectively. The transmitted intensity is a periodic function that rejects spectral components at the ring's resonant wavelengths. The spacing between resonant wavelengths, or free spectral range (FSR), is given by $$FSR = \left|\frac{\lambda^2}{n\cdot L}\right|.$$

Figure 9:
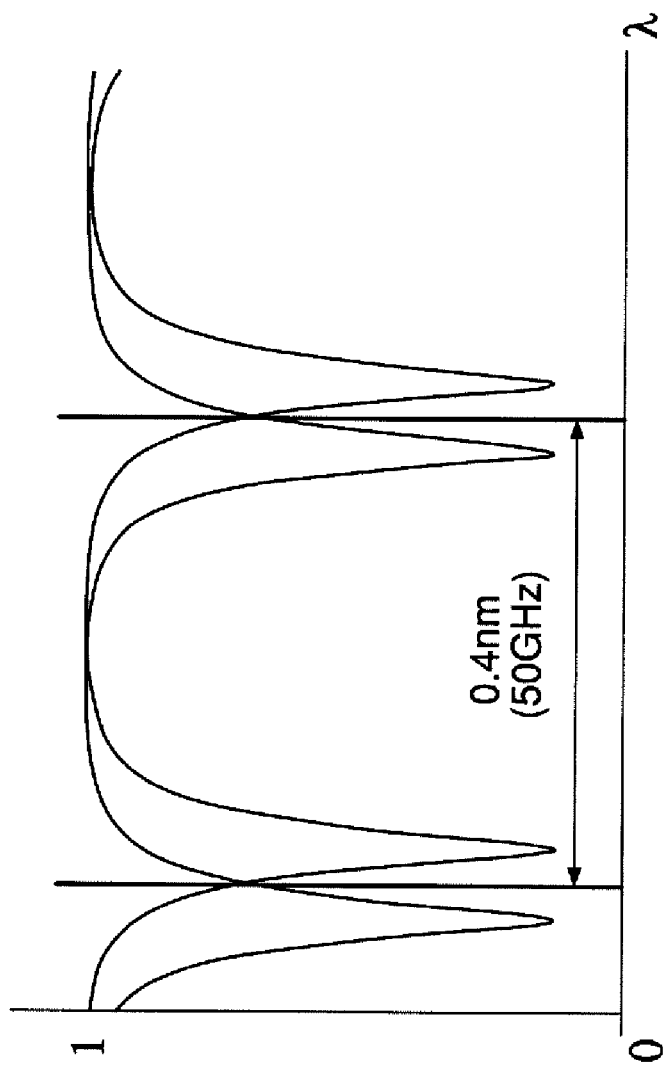
FIG. 9 depicts a diagram of output results from two illustrative resonators suitable for use in a disclosed embodiment.

The size of the ring can be chosen to match the FSR with the WDM channel spacing, as in the conventional etalon-based locker. FIG. 9 provides a diagram of results of two illustrative resonator filters aligned to a channel grid with 50 GHz spacing. In an illustrative example, and assuming an effective waveguide index of 3.19 and a FSR of 0.4 nm, the ring lengths are 1880 μm and 1882.5 μm.

It may occur that after construction of the system, the resonant wavelengths of resonators 216 will not be aligned exactly to the ITU grid. Therefore, it may be useful to fine-tune the position of the second resonator filter with respect to the first. The positions of the transmission minima can be tuned by adjusting the optical lengths of resonators 216a, 216b. This adjustment can be accomplished by any suitable means such as, for example, either by pumping current through the resonator rings, or by raising the temperature of the resonators. Accordingly, in an illustrative embodiment thin-film metal resistors or deposits 222a, 222b are evaporated on top of the resonator waveguide 216a, 216b to act as heaters. The relationship between the resonant wavelengths and temperature is found by setting the sinusoidal term in the transmission equation to zero and taking the differential with respect to the effective index:

$$\frac{\partial \lambda}{\partial T} = \frac{\lambda \partial n}{n \partial T}$$

For InP-based materials, the change in the effective index with temperature is approximately $10^{-4}$ $K^{-1}$. Therefore, in an illustrative example, assuming an effective index of 3.19 and a wavelength of 1.55 μm, the wavelengths of the transmission minima shift with temperature at a rate of 0.049 nm/K. Thus, in an illustrative example, in order to position the filters at the proper location on the ITU grid with a 50 GHz channel spacing (0.4 nm FSR), a maximum temperature change of 4° C. is used. A similar treatment of the FSR reveals that its temperature sensitivity is several orders of magnitude lower than the wavelength sensitivity, and can be treated as constant.

Photodiodes 212a, 212b are also monolithically integrated in the chip with laser 240, splitter 214, and resonators 216a, 216b. Photodiodes 212a, 212b comprise a reverse biased region 242 formed in the top waveguide level and a passive waveguide in the middle waveguide level. The reversed bias region 242 has a different effective index of refraction than the middle level waveguide in the area where the two overlap. The mode of light that propagates primarily in the top waveguide level has an index of refraction different than that of the mode of light propagating primarily in the middle waveguide layer. Accordingly, the modes of light are divided unequally between the waveguides.

Photodiodes 212a, 212b form a basis to measure the laser RIN and maximize the SMSR. Generally, laser RIN measurements may be made using a photodiode, a low-noise trans-impedance amplifier and a microwave power sensor, as disclosed in "RIN IN Multisection MQW-DBR Lasers," IEEE Photonics Technology Letters, Vol. 2, pp. 104–108, 1990, and "Relative Intensity Noise Measurements Of A Widely Tunable Sampled-Grating DBR Laser," IEEE Photonics Technology Letters, Vol 14, pp. 759–61, 2002, the contents of which are hereby incorporated by reference in their entirety. Integration of optical detectors 212a, 212b on the chip frees space in the transmitter module for the amplifier chip and power sensor (typically a diode biased in the 'square-law' portion of its I-V characteristic). Photodiodes 212a, 212b also reveal the optimum laser operating conditions with respect to SMSR, line width, and chirp, as disclosed in "Fully Stabilized Electroabsorption-Modulated Tunable DBR Laser Transmitter For Long-Haul Optical Communications," IEEE Journal On Selected Topics In Quantum Electronics," Vol. 7, pp. 168–77, 2001, and "A Control Loop Which Ensures High Sidemode-Suppression Ratio In A Tunable DBR Laser," IEEE Photonics Technology Letters, Vol. 4 pp. 417–19, 1992, the contents of which are hereby incorporated by reference in there entirety. As the tuning current in laser Bragg gating 232 is varied, both the laser power passing through the grating and the SMSR vary periodically. Maximum SMSR ratios occur at tuning currents where the local change in laser power is zero. Control unit 218 may be modified to add SMSR control loop electronics to monitor these operating characteristics.

The principles and operation of the wavelength stabilized laser described above in connection with FIGS. 2 through 9 can be applied in numerous different embodiments. For example, the wavelength stabilization scheme discussed above in connection with a single frequency tunable laser can applied as well to tunable mode locked lasers. More particularly, wavelength stabilization may be applied to coupled cavity mode locked lasers. Application to coupled cavity mode locked lasers allows for monitoring not only of the wavelength but also frequency spacing.

Figure 10:
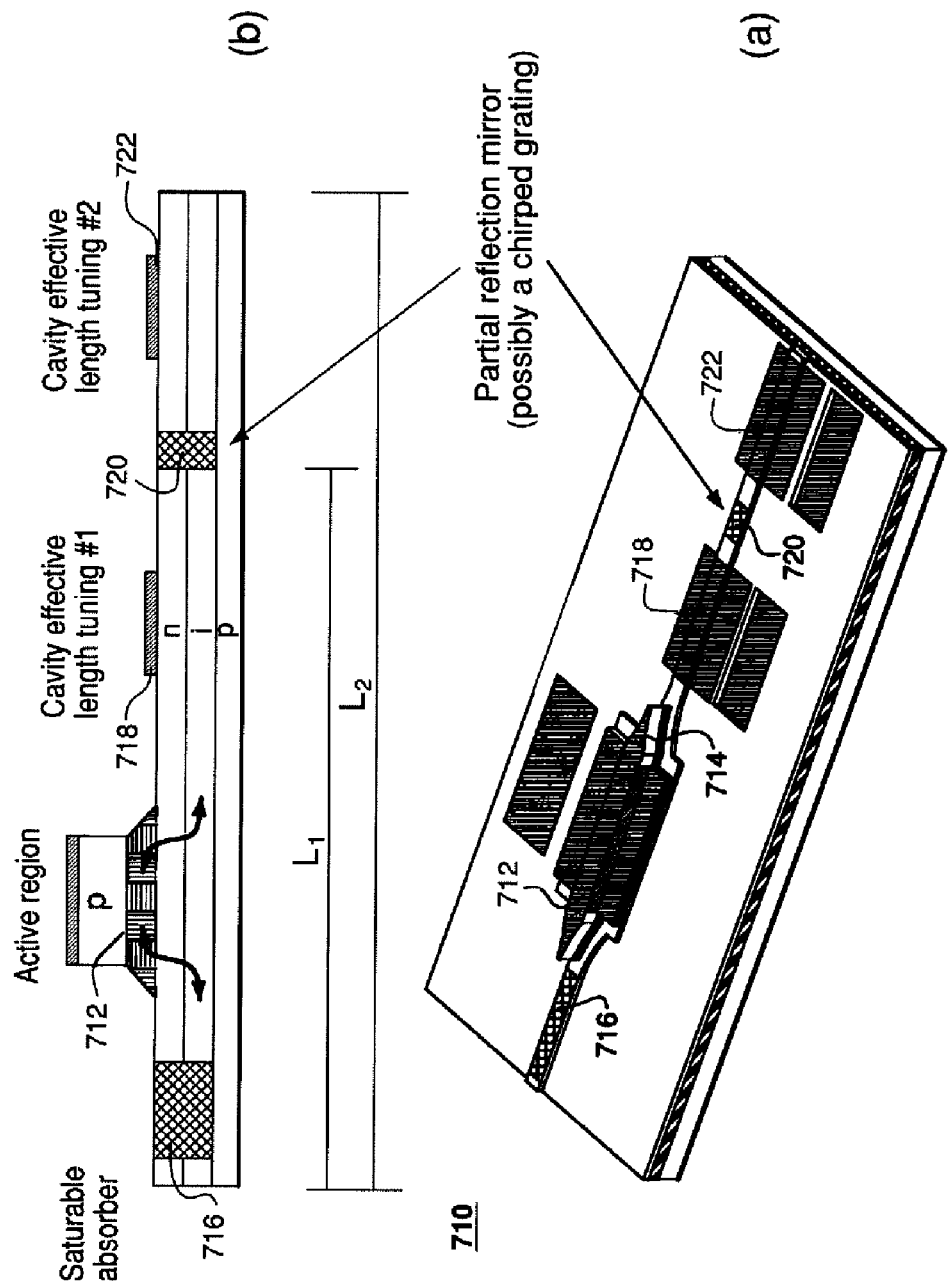

FIG. 10a provides a perspective view, and FIG. 10b provides a sectional view of a coupled cavity tunable locked laser 710 to which wavelength stabilization can be applied. As shown in FIGS. 10a and 10b, tunable locked laser 710 comprises active region 712 which has tapers 714 formed therein, saturable absorber region 716, first cavity tuning region 718, partial reflection mirror 720, and second cavity tuning region 722.

Generally, laser 710 comprises two cavities, with each cavity having its own frequency comb. The lengths of the two cavities are represented in FIG. 10b as $L_1$ and $L_2$. Reflection mirror 720 is positioned between cavity tuning regions 718 and 722, and may be implemented, for example, using a grating that is appropriately chirped to provide sufficient required reflectivity. For example, reflective mirror 718 may provide reflectivity over ~20 nm. Saturable absorber region 716 operates to modulate the output from laser 710 and thereby select allowed modes from the two cavities.

The first cavity of laser 710 has a longitudinal mode spacing of $\Delta f1=c/(2nL1)$. The second cavity has a mode spacing of: $\Delta f2=c/(2nL2)$. By adjusting the effective cavity lengths, L1 and L2, the following relation is achieved: $m\Delta f1=n\Delta f2$ (m and n are co-prime integers). Where this relation exists, the longitudinal mode spacing that satisfies the phase condition of this coupled cavity is $m\Delta f1$ or $m\Delta f1$. Without this coupled cavity geometry, a repetition rate of the mode locked laser will be limited by its total length, which in turn is limited by the maximum modal gain that can be achieved in the active region.

Laser 710 is formed from asymmetric waveguides. Active gain region 712 is formed in a first waveguide with a second waveguide formed below it. The two waveguides are designed to have different effective indices of refraction. Accordingly, in the area where the two waveguides overlap, a first mode of light propagates in the first waveguide comprising gain region 712, and a second mode of light propagates in the second waveguide below. The modes of light divided unequally between the waveguides. Tapers 714, which may be, for example, lateral tapers, are formed in the first waveguide to facilitate the movement of light between waveguides.

Laser 710 is enhanced by the application of wavelength stabilization features analogous to those described above in connection with FIGS. 2 through 9. In applying these concepts to a coupled cavity mode locked laser, it is useful to account for the multiple frequencies that are associated with a mode locked laser. In particular, it is useful to monitor two frequencies such as, for example, the center frequency and one of the neighboring frequencies of the laser output. Monitoring two frequencies allows for monitoring the central frequency/wavelength and the spacing between frequencies.

Figure 11:
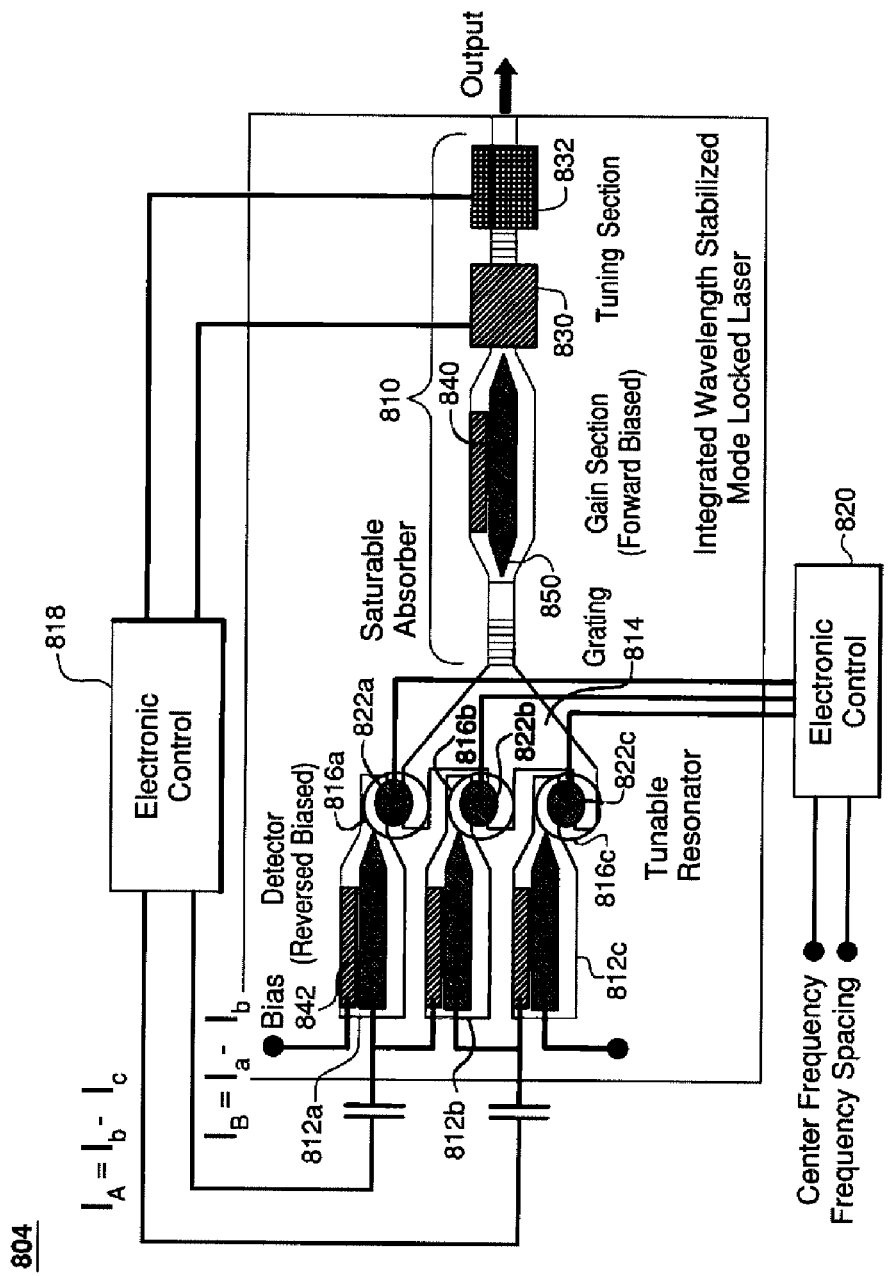
FIG. 11 depicts an illustrative wavelength stabilized coupled cavity tunable mode locked laser system.

FIG. 11 depicts an illustrative wavelength stabilized coupled cavity tunable mode locked laser system 804. As shown in FIG. 11, laser 810 is communicatively coupled via splitter 814 and three non-identical reference resonators 816a, 816b, 816c to photodiode detectors 812a, 812b, and 812c. Laser 810, splitter 814, detectors 812a–c, and ring resonators 816a–c are formed on a single chip and are integrated using asymmetric waveguides as disclosed in U.S. Pat. No. 6,381,380. System 804 further comprises control 818 which monitors the output of photodiodes 812a, 812b, 812c, and adjusts laser 810 to stabilize the laser output to a desired wavelength. System 804 also comprises metal resistors or deposits 822a, 822b, 822c, and corresponding control 820 that are employed in tuning the system to a desired wavelength.

Resonators 810 are purposefully designed to have different lengths so as to cause their respective wavelengths, $\lambda_a$, $\lambda_b$, $\lambda_c$, to be slightly different. The system operates on the principle that when laser 810 is correctly operating, the first two wavelengths of the mode locked laser frequency comb are positioned at the midpoints between the wavelengths of the successive resonators 816a, 816b, 816c. When the first two wavelengths of the mode locked laser frequency comb are positioned at the midpoints between the resonant wavelengths of the successive resonators 816a, 816b, and 816c, the photocurrents from the corresponding successive resonators 810 are substantially equal ($I_B=I_b-I_c=0$, $I_A=I_a-I_b=0$). In other words, a stabilized laser is indicated where there is a vanishing differential in the responses of photodiode detectors 812a, 812b, 812c. A shift in either of the fist two wavelengths of the laser frequency comb causes the difference between the photocurrent outputs ($I_B=I_b-I_c$, $I_A=I_a-I_b$) to increase. A shift in the value of either $I_B$ or $I_A$ signals to control unit 820 that one or both of the first two wavelengths of the mode locked laser frequency comb may have "drifted" from the desired value.

Figure 12:
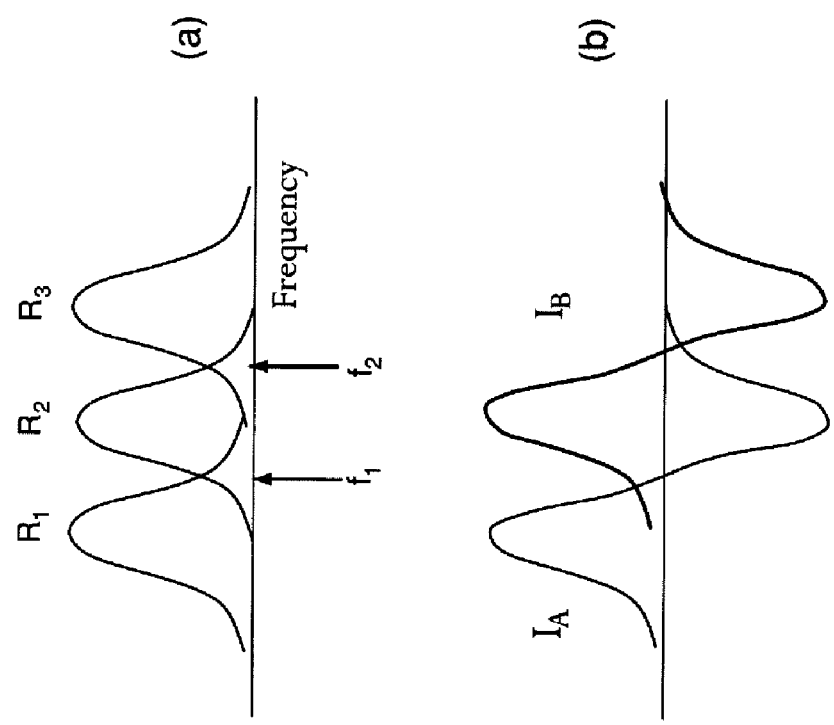
FIG. 12a depicts the desired locations of successive wavelengths in a frequency comb of an illustrative laser signal.
FIG. 12b depicts the values for the combined photocurrent outputs for the photodiodes in the system of FIG. 11.

The photocurrent outputs or a composite signal corresponding to the photocurrent outputs is fed to control circuit 218. In an illustrative embodiment, the composite value may comprise, for example, the difference $I_{Diff}$, between the photocurrent outputs. Control unit 818 operates to minimize the differences between $I_A$ and $I_B$ by controlling tuning phase sections 830 and 832 of laser 810 to stabilize the wavelengths of the mode locked laser frequency comb between the resonant wavelengths of the successive resonators 816. FIG. 12a depicts the desired locations for wavelengths at the locations where $I_A$ and $I_B$ are equal. FIG. 12b depicts the values for the combined photocurrent outputs for the photodiodes.

Control unit 820 operates to move the output from laser 810 to an equilibrium point which represents an acceptable wavelength for the first two wavelengths of the frequency comb. In particular, depending on the values for $I_A$ and $I_B$, control unit 820 outputs signals to control tuning sections 830, 832 to move the laser output to the desired equilibrium points. The control unit may comprise, for example, a look up table (LUT) which can be used to convert target frequency input into tuning signals for tunable sections 830, 832. Although the control unit could alternatively be an appropriately designed passive circuit, an embodiment using a LUT has an additional advantage of being programmable and thereby allowing for a "learning phase" to account for variations in the integrated photonic components. In the illustrative embodiment, the gratings of laser 810 have a broad passband, and therefore unlike laser 210 discussed in connection with FIG. 2, does not need to be tuned.

The illustrative laser system 804 can be tuned to desired wavelengths for two wavelengths of the mode locked laser frequency comb. Generally, this is accomplished by altering the refractive index of resonators 812a, 812b, 812c which in turn results in a change in the wavelengths of resonators 810. Altering the wavelengths of resonators 810 changes the midpoint between the wavelengths of the successive resonators 816 which, as described above, represents the desired wavelengths for the first two wavelengths of the laser frequency comb. Thus, the laser system can be "tuned," i.e. a desired laser output wavelength selected, by changing the refractive index of resonators 816a, 816b, 816c. Changing the refractive index of the resonators 810 can be accomplished by any suitable means such as, for example, current induced plasma loading, voltage induced Franz-Keldysh effect, quantum confined Stark effect, and heating effect. In an illustrative embodiment, metallic resistors or deposits 822 are positioned proximate resonators 816 and are controlled by electronic control 820. Resistors 822 may be used to add heat to the system as required to control the temperature of resonators 816a, 816b, 816c and thereby control the refractive index of the resonator.

Figure 13:
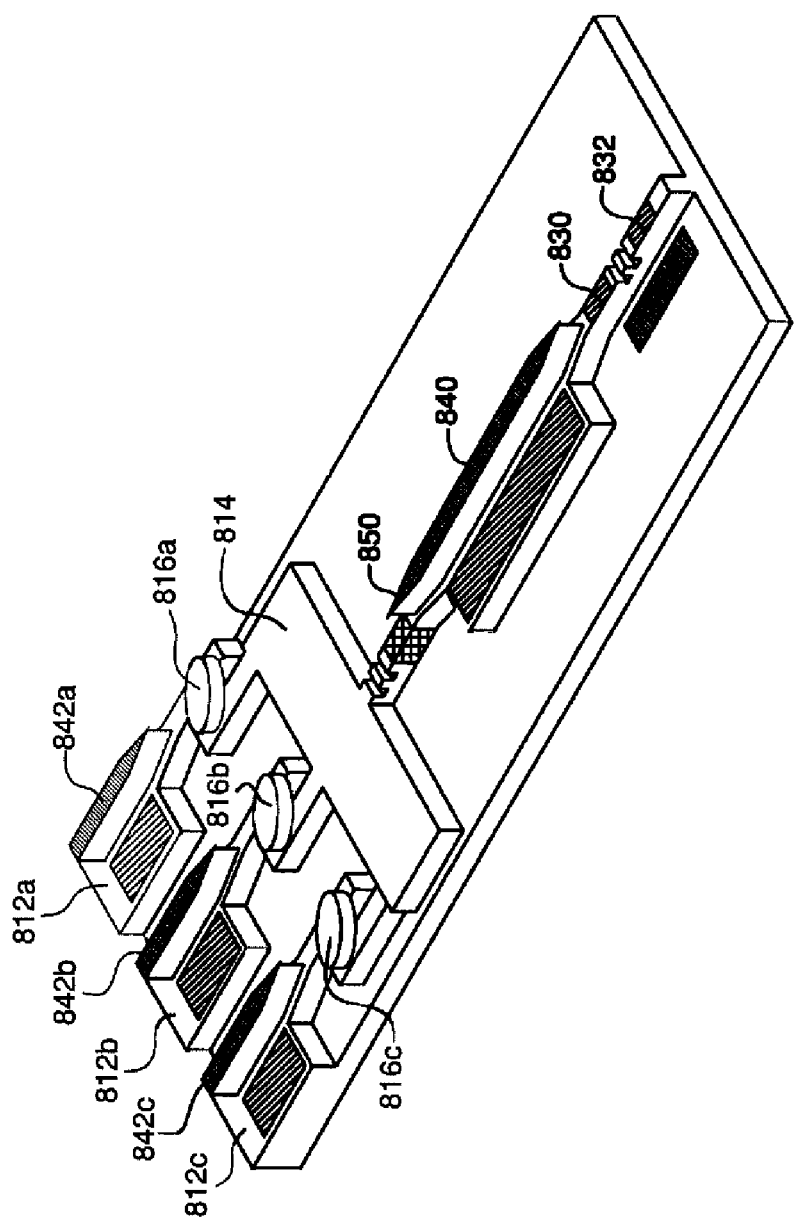
FIG. 13 is a perspective view of the system of FIG. 11.

Illustrative system 804 is formed in a monolithic chip using asymmetric waveguides. FIG. 13 provides a perspective view of the system. In the illustrative system, laser 810, splitter 814, resonators 816a, 816b, 816c, and photodiode detectors 812a, 812b, 812c are formed in a multi-level asymmetric waveguide circuit. A top level has a waveguide gain section 840 of laser 810 formed therein which contains quantum wells that are forward biased. The top level also has formed therein reversed bias regions 842 of photodiode detectors 812a, 812b, 812c. A second level of the waveguide circuit, which is formed below the top level, has grating section 844, phase sections 830, 832, and saturable absorber 860 of DBR laser 810 formed therein. The second waveguide level further has formed therein splitter 814 and ring resonators 816a, 816b, and 816c.

The waveguide components are formed so that different modes of light having different indices of refraction are divided unequally between the waveguides in the areas where the waveguides overlap. Thus, where gain region 840 in the top waveguide level overlaps with the waveguide positioned below it, a first mode of light propagates primarily in the gain region and a second mode of light with a different index of refraction propagates primarily in the waveguide below. The modes of light are divided unequally between the waveguides. Likewise, in the location where absorption section 842 of photo-diodes 812 overlaps with the middle level waveguide, a first mode of light propagates primarily in the gain region and a second mode of light with a different index of refraction propagates primarily in the waveguide below. Again, the modes of light are divided unequally between the waveguides. Lateral tapers 850 are strategically formed in the waveguides to facilitate the movement of power between the waveguides.

Thus, improved monolithic wavelength stabilized laser systems have been disclosed. A laser output is split and communicatively coupled to at least two photodiodes via non-identical resonators. The laser, splitter, photodiodes, and resonators are formed in a monolithic chip and integrated using asymmetric waveguides. The outputs from non-identical resonators and photodiodes are used by a control unit to adjust the operation of the laser to maintain a desired wavelength in the laser output.

While specific embodiments are disclosed herein, those skilled in the art will recognize that modification and variations may be made without departing from the underlying principles. For example, lasers other than single frequency lasers and coupled cavity tunable mode locked lasers may be employed in a wavelength stabilization system in accord with the present disclosure. Similarly, various types of splitters, resonators, and detectors may be employed. Accordingly, reference should be made to the appended claims as indicating the scope of the potential embodiments.

What is claimed is:

1. A method for wavelength stabilization in a monolithic laser system, comprising:
at a laser, generating a laser signal;
at a waveguide splitter monolithically formed with the laser, dividing the laser signal into a first signal portion and a second signal portion;
at a first resonator monolithically formed with the splitter and tuned to a first wavelength, filtering the first signal portion to generate a filtered first signal;
at a second resonator monolithically formed with the splitter and tuned to a second wavelength, filtering the second signal portion to generate a filtered second signal;
at a first photodiode monolithically formed with the first resonator, generating a first photocurrent from the filtered first signal;
at a second photodiode monolithically formed with the second resonator, generating a second photocurrent from the filtered second signal;
determining using at least one of the first photo current and the second photocurrent whether the laser signal has a desired wavelength; and
altering the laser signal
wherein generating a laser signal comprises generating a laser signal in a laser comprising a first waveguide having a gain region formed therein for amplifying at least a first mode of light propagating primarily in the first waveguide, and second waveguide for guiding primarily a second mode of light, the first mode of light and the second mode of light having different effective indices of refraction and divided unevenly between the first waveguide and the second waveguide where the first waveguide and the second waveguide overlap.

2. The method of claim 1, wherein generating a laser signal comprises generating a single frequency laser signal.

3. The method of claim 1, wherein dividing the laser signal into a first signal portion and a second signal portion comprises propagating the laser signal through a waveguide splitter having a first waveguide branch for dividing out the first signal portion and a second waveguide branch for dividing out the second signal portion.

4. The method of claim 1, wherein filtering the first signal portion to generate a filtered first signal comprises filtering the first signal portion using at least one of the following: a ring resonator; a disk resonator; and grating co-directional coupler.

5. The method of claim 1, wherein filtering the second signal portion to generate a filtered second signal comprises filtering the second signal portion using at least one of the following: a ring resonator; a disk resonator; and grating co-directional coupler.

6. The method of claim 1, wherein generating a first photocurrent from the filtered first signal comprises generating a first photocurrent at a photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second wave guide overlap.

7. The method of claim 6, wherein generating a second photocurrent from the filtered second signal comprises generating a second photocurrent at a photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second wave guide overlap.

8. The method of claim 1, wherein determining using at least one of the first photocurrent and the second photocurrent whether the laser signal has a desired wavelength comprises deriving a difference between the first photocurrent and the second photocurrent.

9. The method of claim 1, wherein altering the laser signal comprises altering the laser signal to have a wavelength between the first wavelength and the second wavelength.

10. The method of claim 9, wherein altering the laser signal to have a wavelength between the first wavelength and the second wavelength comprises altering the wavelength to have a wavelength at the midpoint between the first wavelength and the second wavelength.

11. The method of claim 1, further comprising changing the resonant wavelength of the first resonator.

12. The method of claim 11, wherein changing the resonant wavelength of the first resonator comprises heating the first resonator.

13. The method of claim 11, further comprising changing the resonant wavelength of the second resonator.

14. The method of claim 13, wherein changing the resonant wavelength of the first resonator comprises heating the first resonator.

15. The method of claim 1, wherein generating a laser signal comprises generating a laser signal at a coupled cavity mode locked laser.

16. The method of claim 15, wherein at a waveguide splitter monolithically formed with the laser dividing the laser signal into a first signal portion and a second signal portion farther comprises dividing the laser signal into a third signal portion.

17. The method of claim 16, further comprising at a third resonator monolithically formed with the splitter and tuned to a third wavelength filtering the third signal portion to generate a filtered third signal.

18. The method of claim 17, further comprising at a third photodiode monolithically formed with the third resonator generating a third photocurrent from the filtered third signal.

19. The method of claim 18, wherein determining using at least one of the first photocurrent and the second photocurrent whether the laser signal has a desired wavelength comprises determining using at lest one of the first photocurrent, the second photocurrent, and third photocurrent whether the laser signal has a desired wavelength.

20. The method of claim 19, wherein determining using at least one of the first photocurrent, the second photocurrent, and third photocurrent whether the laser signal has a desired wavelength comprises calculating the difference between the first photocurrent and the second photocurrent and calculating the difference between the second photocurrent and the third photocurrent.

21. The method of claim 20, wherein altering the laser signal comprises altering the laser signal to have a first wavelength of a frequency comb between the first wavelength and the second wavelength and to have a second wavelength of a frequency comb between the second wavelength and the third wavelength.

22. The method of claim 21, wherein altering the laser signal to have a first wavelength of a frequency comb between the first wavelength and the second wavelength and to have a second wavelength of a frequency comb between the second wavelength and the third wavelength comprises altering the laser signal to have a first wavelength of a frequency comb at the midpoint between the first wavelength and the second wavelength and to have a second wavelength of a frequency comb at the midpoint between the second wavelength and the third wavelength.

23. A method for wavelength stabilization in a monolithic asymmetric laser system, comprising:
   generating a laser signal in a laser comprising a first waveguide having a gain region formed therein for amplifying at least a first mode of light propagating primarily in the first waveguide, and second waveguide for guiding primarily a second mode of light, the first mode of light and the second mode of light having different effective indices of refraction and divided unevenly between the first waveguide and the second waveguide where the first waveguide and the second waveguide overlap
   at a waveguide splitter monolithically formed with the laser, dividing the laser signal into a first signal portion and a second signal portion;
   at a first resonator monolithically formed with the splitter and tuned to a first wavelength, filtering the first signal portion to generate a filtered first signal;
   at a second resonator monolithically formed with the splitter and tuned to a second wavelength, filtering the second signal portion to generate a filtered second signal;
   at a first photodiode monolithically formed with the first resonator, generating a first photocurrent from the filtered first signal, said first photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second waveguide overlap;

at a second photodiode monolithically formed with the second resonator, generating a second photocurrent from the filtered second signal, said second photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second waveguide overlap;

determining using at least one of the first photo current and the second photocurrent whether the laser signal has a desired wavelength; and altering the laser signal.

24. A method for wavelength stabilization in a monolithic laser system, comprising:

at a coupled cavity mode locked laser, generating a laser signal;

at a waveguide splitter monolithically formed with the laser, dividing the laser signal into a first signal portion, a second signal portion, and a third signal portion;

at a first resonator monolithically formed with the splitter and tuned to a first wavelength, filtering the first signal portion to generate a filtered first signal;

at a second resonator monolithically formed with the splitter and tuned to a second wavelength, filtering the second signal portion to generate a filtered second signal;

at a third resonator monolithically formed with the splitter and tuned to a third wavelength, filtering the third signal portion to generate a filtered third signal;

at a first photodiode monolithically formed with the first resonator, generating a first photocurrent from the filtered first signal;

at a second photodiode monolithically formed with the second resonator, generating a second photocurrent from the filtered second signal;

at a third photodiode monolithically formed with the third resonator, generating a third photocurrent from the filtered third signal;

determining using at least one of the first photo current and the second photocurrent whether the laser signal has a desired wavelength; and altering the laser signal.

25. A laser wavelength stabilizing system, comprising:

a laser adapted to generate a laser signal;

an optical splitter monolithically formed with said laser and comprising a first waveguide branch and a second waveguide branch, said optical splitter adapted to receive the optical signal from said laser and generate a first signal portion in said first waveguide branch and a second signal portion in said second waveguide branch;

a first resonator monolithically formed with said first branch of said optical splitter and tuned to a first wavelength, said first resonator adapted to filter said first signal portion and generate a filtered first signal portion;

a second resonator monolithically formed with said second branch of said optical splitter and tuned to a second wavelength, said second resonator adapted to filter said second signal portion and generate a filtered second signal portion;

a first photodiode monolithically formed with said first resonator, said first photodiode adapted to detect said filtered first signal portion and generate a first photocurrent;

a second photodiode monolithically formed with said second resonator, said second photodiode adapted to detect said filtered second signal portion and generate a second photocurrent; and a control unit adapted to determine using at least one of the first photocurrent and the second photocurrent whether the laser signal has a desired wavelength wherein said laser comprises a first waveguide having a gain region formed therein for amplifying at least a first mode of light propagating primarily in the first waveguide and a second waveguide for guiding primarily a second mode of light, the first mode of light and the second mode of light having different effective indices of refraction and divided unevenly between the first waveguide and the second waveguide in an area where the first waveguide and the second waveguide overlap.

26. The system of claim 25, wherein said control unit is adapted to receive a signal corresponding to said first photocurrent and said second photocurrent.

27. The system of claim 26, wherein said control unit is further adapted to generate a difference between said first photocurrent and said second photocurrent.

28. The system of claim 25, wherein said control unit is further adapted to communicate with said laser to alter said laser signal.

29. The system of claim 28, wherein said control unit is adapted to alter the laser signal to have a wavelength between the first wavelength and the second wavelength.

30. The system of claim 25, wherein said laser is a single frequency laser.

31. The system of claim 25, wherein said first resonator comprises a ring resonator and said second resonator comprises a ring resonator.

32. The system of claim 25 wherein said first photodiode comprises a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second wave guide overlap.

33. The system of claim 32, wherein said second photodiode comprises a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second waveguide overlap.

34. The system of claim 25, further comprising a first metallic deposit operatively coupled to said first resonator for heating said first resonator and effecting the wavelength of said first resonator, and a second metallic deposit operatively coupled to said second resonator for heating said second resonator and effecting the wavelength of said second resonator.

35. The system of claim 34, further comprising a second control unit operatively coupled to said first metallic deposit and said second metallic deposit and adapted to cause the temperature of said first metallic deposit and said second metallic deposit to change.

36. The system of claim 25, wherein said laser is a coupled cavity mode locked laser.

37. The system of claim 36, wherein said optical splitter further comprises a third waveguide branch and is farther adapted to generate a third signal portion in said third waveguide branch.

38. The system of claim 37, further comprising a third resonator monolithically formed with said third branch of said optical splitter and tuned to a third wavelength, said third resonator adapted to filter said third signal portion and generate a filtered third signal portion.

39. The system of claim 38, further comprising a third photodiode monolithically formed with said third resonator, said third photodiode adapted to detect said filtered third signal portion and generate a third photo current.

40. The system of claim 39, farther comprising a control unit adapted to adapted to receive a signal corresponding to said first photocurrent, said second photocurrent, and said third photocurrent.

41. The system of claim 40, wherein said control unit is further adapted to generate a difference between said first photocurrent and said second photocurrent and generate a difference between said second photocurrent and said third photocurrent.

42. The system of claim 40, wherein said control unit is further adapted to communicate with said laser to alter said laser signal.

43. The system of claim 42, wherein said control unit is adapted to alter the laser signal to have a first wavelength of a frequency comb at point between the first wavelength and the second wavelength and to have a second wavelength of a frequency comb at a point between the second wavelength and the third wavelength.

44. A laser wavelength stabilizing system, comprising:
a laser adapted to generate a laser signal, said laser comprising a first waveguide having a gain region formed therein for amplifying at least a first mode of light propagating primarily in the first waveguide and a second waveguide for guiding primarily a second mode of light, the first mode of light and the second mode of light having different effective indices of refraction and divided unevenly between the first waveguide and the second waveguide in an area where the first waveguide and the second waveguide overlap;
an optical splitter monolithically formed with said laser and comprising a first waveguide branch and a second waveguide branch, said optical splitter adapted to receive an optical signal from said laser and generate a first signal portion in said first waveguide branch and a second signal portion in said second waveguide branch;
a first resonator monolithically formed with said first branch of said optical splitter and tuned to a first wavelength, said first resonator adapted to filter said first signal portion and generate a filtered first signal portion;
a second resonator monolithically formed with said second branch of said optical splitter and tuned to a second wavelength, said second resonator adapted to filter said second signal portion and generate a filtered second signal portion;
a first photodiode monolithically formed with said first resonator, said first photodiode adapted to detect said filtered first signal portion and generate a first photocurrent, said first photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second waveguide overlap; and
a second photodiode monolithically formed with said second resonator, said second photodiode adapted to detect said filtered second signal portion and generate a second photocurrent, said second photodiode comprising a first waveguide having a detector region formed therein for detecting at least a first mode of light propagating primarily in the first waveguide and second waveguide for guiding primarily a second mode of light, the first mode of light and the second mode of light having different effective indices of refraction and divided unevenly between the first waveguide and the second waveguide in an area where the first waveguide and the second waveguide overlap.

45. A laser wavelength stabilizing system, comprising:
a coupled cavity mode locked laser adapted to generate a laser signal;
an optical splitter monolithically formed with said laser and comprising a first waveguide branch, a second waveguide branch, and a third waveguide branch, said optical splitter adapted to receive an optical signal from said laser and generate a first signal portion in said first waveguide branch, a second signal portion in said second waveguide branch, and a third signal portion in said third waveguide branch;
a first resonator monolithically formed with said first branch of said optical splitter and tuned to a first wavelength, said first resonator adapted to filter said first signal portion and generate a filtered first signal portion;
a second resonator monolithically formed with said second branch of said optical splitter and tuned to a second wavelength, said second resonator adapted to filter said second signal portion and generate a filtered second signal portion;
a third resonator monolithically formed with said third branch of said optical splitter and tuned to a third wavelength, said third resonator adapted to filter said third signal portion and generate a filtered third signal portion;
a first photodiode monolithically formed with said first resonator, said first photodiode adapted to detect said filtered first signal portion and generate a first photocurrent;
a second photodiode monolithically formed with said second resonator, said second photodiode adapted to detect said filtered second signal portion and generate a second photocurrent; and
a third photodiode monolithically formed with said third resonator, said third photodiode adapted to detect said filtered third signal portion and generate a third photocurrent.

* * * * *